United States Patent
Hu

(10) Patent No.: US 6,642,608 B1
(45) Date of Patent: Nov. 4, 2003

(54) MON$_X$ RESISTOR FOR SUPERCONDUCTOR INTEGRATED CIRCUIT

(75) Inventor: Roger Hu, Lawndale, CA (US)

(73) Assignee: Northrop Grumman Corporation, Redondo Beach, CA (US)

( * ) Notice: Subject to any disclaimer, the term of this patent is extended or adjusted under 35 U.S.C. 154(b) by 0 days.

(21) Appl. No.: 10/209,413

(22) Filed: Jul. 31, 2002

(51) Int. Cl.$^7$ ................................................ H01L 37/00
(52) U.S. Cl. ...................... 257/661; 257/663; 257/536; 257/30; 257/35; 438/2
(58) Field of Search ................................ 257/661, 663, 257/662, 536, 537, 30–35, 37; 438/2

(56) References Cited

U.S. PATENT DOCUMENTS

| | | | | |
|---|---|---|---|---|
| 4,554,567 A | * | 11/1985 | Jillie et al. .................... | 357/5 |
| 4,563,695 A | * | 1/1986 | Tarutani et al. ................ | 357/5 |
| 5,760,463 A | * | 6/1998 | Hato .......................... | 257/662 |
| 5,897,367 A | * | 4/1999 | Kerber et al. ............... | 438/622 |
| 5,962,865 A | | 10/1999 | Kerber et al. | |
| 6,188,084 B1 | | 2/2001 | Kerber et al. | |

FOREIGN PATENT DOCUMENTS

| | | | |
|---|---|---|---|
| JP | 59135782 A | * | 8/1984 |
| JP | 06061535 A | * | 3/1994 |

OTHER PUBLICATIONS

C.J. Wilson et al., "Nb Oxide Thin Film Resistors," *IEEE Transaction on Applied Superconductivity*, vol. 9, No. 2, Jun. 1999, pp. 1724–1726.

Karl K. Berggren, et al., "Low T$_c$ Superconductive Circuits Fabricated on 150–mm–Diameter Wafers Using a Doubly Planarized Nb/AIO$_x$/Nb Process," *IEEE Transaction on Applied Superconductivity*, vol. 9, No. 2, Jun. 1999, pp. 3271–3274.

D. Gerstenberg and C.J. Calbick, "Effects of Nitrogen, Methane, and Oxygen on Structure and Electrical Properties of Thin Tantalum Films," *Journal of Applied Physics*, vol. 35, No. 2, Feb. 1964, pp. 402–407.

G.L. Kerber, L.A. Abelson, R.N. Elmadjian, G. Hanaya, and E.G. Ladizinski, "An Improved NbN intergrated Circuit Process Featuring thick NbN Ground Plane and Lower Parasitic Circuit Inductances," *IEEE Transactions on Applied Superconductivity*, vol. 7, No. 2, Jun. 1997, pp. 2638–2643.

Hyuek Joon Lee, Mandar S. Mudholkar, Levi T. Thompson, "Surface Properties of Molybdenum Nitride Thin Films," *Mat. Res. Soc. Symp. Proc.*, vol. 368, 1995 pp. 45–50.

* cited by examiner

*Primary Examiner*—Nathan J. Flynn
*Assistant Examiner*—Remmon R. Fordé
(74) *Attorney, Agent, or Firm*—Posz & Bethards, PLC

(57) ABSTRACT

A superconductor integrated circuit (10) includes a silicon substrate (12) a niobium ground layer (14), an anodized niobium first ground insulator layer (16), a second ground insulator layer (22), a molybdenum nitrogen (MoN$_x$) resistor (18) provided between the first and second ground insulator layers (16, 22), a Josephson junction (23) provided above the first and second ground insulator layers (16, 22), first and second oxide insulators (27, 30), and a niobium interconnect (28) for providing electrical communication with the Josephson junction. The MoN$_x$ first resistor (18) provides a sheet resistance of between 3–5 ohms/sq at 4° K with a thickness of approximately 95 nm and enables the superconductor integrated circuit (10) to have a critical current density between 6–8 kA/cm$^2$.

8 Claims, 6 Drawing Sheets

MoNx vs. Sheet Resistance

| N2 flow (sccm) | 300K Sheet Resistance | 4K Sheet Resistance |
|---|---|---|
| 0.2 | 3.619 | 2.907 |
| 0.31 | 4.839 | 4.095 |
| 0.34 | 5.146 | 4.406 |
| 0.4 | 5.488 | 4.793 |
| 0.45 | 6.152 | 5.508 |
| 0.61 | 7.110 | 0.000 |
| 0.71 | 8.135 | 0.000 |

← Superconducting at 4K

Figure 5

MON$_x$ RESISTOR FOR SUPERCONDUCTOR INTEGRATED CIRCUIT

FIELD OF THE INVENTION

The present invention relates to superconductor integrated circuits and, more particularly, to an MoN$_x$ resistor for use in superconductor integrated circuit fabrication.

BACKGROUND

Superconductor integrated circuits include active devices, such as Josephson tunnel junctions, as well as passive devices such as resistors, capacitors, and inductors. Device operating parameters depend on the type of application in which the circuits are to be implemented. Varying the operating parameters of one of these devices often results in a need to change the parameters of one or more of the other devices.

The Josephson tunnel junction is the foundation of a superconductor integrated circuit. The relationship between the Josephson tunnel junction and the superconductor integrated circuit is analogous to the relationship between a transistor and a semiconductor integrated circuit. One characteristic of the Josephson tunnel junction is the critical current, which is the maximum superconducting current through the tunnel barrier.

Improved superconductor integrated circuit fabrication methods produce a superconductor integrated circuit with an increased critical current density. The increased critical current density results in a need for a resistor with a higher sheet resistance for certain circuit applications. Increasing the critical current density further requires a higher shunt resistance in parallel with the Josephson junction due to a smaller junction capacitance. Specifically, a resistor with a sheet resistance of approximately 3 ohms/square at 4° Kelvin is required. In addition, the material used to form the resistor and the resistor fabrication process must be compatible with existing superconductor integrated circuit fabrication processes because the temperature and chemistry of resistor materials during resistor fabrication may adversely affect other devices on a superconductor integrated circuit wafer. Also, the process of fabricating the resistor must be easily reproducible for economic feasibility.

Molybdenum, palladium and other metals are used to form resistors in the fabrication of superconductor integrated circuits. However, the use of such metals results in resistivity values that are too low for high-speed circuit applications. A film thickness (resistor area) cannot be decreased to increase the resistance value of a resistor due to fabrication problems associated with very thin films. Specifically, because a silicon dioxide surface of a wafer on which a superconductor integrated circuit is formed is rough on an atomic level, the silicon dioxide surface may punch through the film forming the resistor or otherwise disrupt film growth if the film is too thin. In addition, a thin film may diffuse into the silicon dioxide by atomic diffusion. A very thick film of high resistivity should also not be used to form due to step coverage problems with layers of film deposited on top of the resistor.

Accordingly, an object of the present invention is to provide a resistor with a high sheet resistance for use in superconductor integrated circuit fabrication.

A further object of the present invention is to provide a superconductor integrated circuit resistor with a film thickness between 70 and 150 nm.

A further object of the present invention is to provide an easily reproducible method of fabricating a superconductor integrated circuit resistor in a manner consistent with existing superconductor integrated circuit fabrication processes.

SUMMARY OF THE INVENTION

Accordingly, the present invention provides a resistor with a high sheet resistance for use in superconductor integrated circuit (superconductor) fabrication, and a method of manufacturing the same. The superconductor includes a silicon substrate, a niobium ground layer, a first ground insulator layer formed from an anodized niobium and a second ground insulator layer formed from an oxide. A first resistor made of a chemical compound of molybdenum and nitrogen (MoN$_x$) is provided between the first and second ground insulator layers, and a Josephson junction is provided above the first and second ground insulator layers. First and second oxide insulators isolate the various superconductor active and passive devices. Niobium interconnects provide electrical communication between an outer terminal and the various superconductor devices, as well as between elements of the superconductor circuit.

A method of fabricating the superconductor includes sputter depositing a niobium ground layer over a silicon substrate and subsequently reactive ion etching the niobium ground layer by photolithography. Next, niobium is anodized for forming a first ground insulator. MoN$_x$ is then sputter deposited over the niobium ground insulator layer and reactive ion etched by photolithography for forming a first resistor. A photoresist pattern is applied over the first resistor and first ground insulator. A niobium—nitrogen compound is sputter deposited over the photoresist and the photoresist is subsequently lifted off the first resistor and first ground insulator layer for forming a second resistor. Silicon dioxide is sputter deposited over the first and second resistors and is then subsequently reactive ion etched by photolithography for forming a second ground insulator layer. A niobium layer is then sputter deposited over an aluminum— aluminum oxide compound which is then sputter deposited over another niobium layer and subsequently reactive ion etched by photolithography for forming a Josephson junction. A plurality of insulators and interconnects are then sputter deposited over the Josephson junction.

The superconductor provided according to the above method has a Josephson junction with a critical current density of 6 to 8 kA/cm and a first resistor sheet resistance between 3–5 ohms/square at 4° Kelvin.

BRIEF DESCRIPTION OF THE DRAWINGS

Additional objects and advantages of the present invention will be more readily apparent from the following detailed description of preferred embodiments thereof when taken together with the accompanying drawings in which:

FIG. 5 is a table showing a relationship between N$_2$ flow rate during fabrication of the superconductor in FIG. 1 and the first resistor sheet resistance.

DESCRIPTION OF THE PREFERRED EMBODIMENTS

Figure 1:
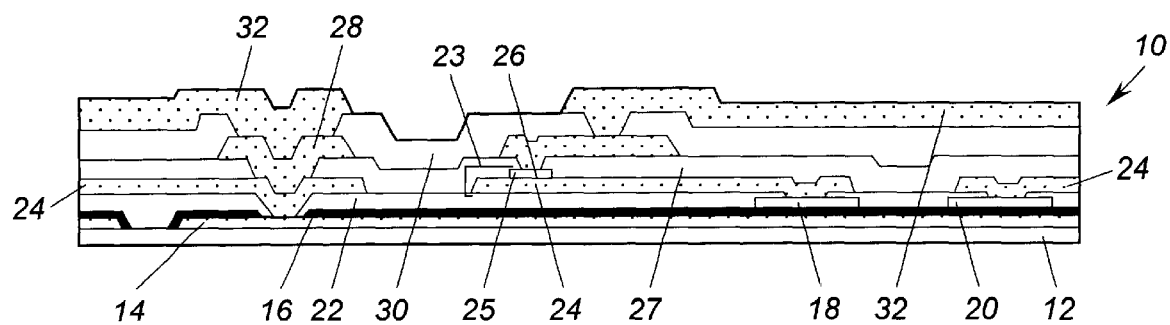
FIG. 1 is a cross-sectional side elevation view of a superconductor fabricated according to a preferred methodology of the present invention.

Referring now to the drawings in which like numerals reference like parts, FIG. 1 shows a cross-sectional view of a superconductor integrated circuit (superconductor) 10 according to the present invention. The superconductor 10 includes a silicon substrate 12 that may be any conventional polished silicon wafer and that is preferably a 4 inch oxidized silicon substrate square. A ground layer 14 composed of niobium with a thickness of approximately 150 nm is provided over the silicon substrate 12. A first ground insulator layer 16 composed of niobium oxide ($Nb_2O_5$) formed from anodized niobium is provided over the ground layer 14.

A first resistor 18 and a second resistor 20 are provided between the first ground insulator layer 16 and a second ground insulator layer 22. The first resistor 18 is a film composed of molybdenum chemically bonded with a predetermined concentration of nitrogen. A ratio of nitrogen to molybdenum, or $MoN_x$, is between 0 and 1. The first resistor 18 preferably has a thickness of approximately 70 nm to 150 nm and a sheet resistance of approximately 3–5 ohms/square at a temperature of 4° Kelvin.

The second resistor 20 is a film composed of niobium chemically bonded with a predetermined concentration of nitrogen, and preferably has a thickness of approximately 140 nm. The second ground insulator layer 22 is composed of silicon dioxide and preferably has a thickness of approximately 150 nm. The second ground insulator layer 22 provides electrical isolation between the first and second resistors 18, 20 and subsequent superconducting layers.

It should be noted at this point that the first resistor 18 has several possible uses depending upon the particular superconductor circuit design and layout. For example, one important use is as a shunt resistor for a superconductor circuit Josephson junction 23. As circuit speed is increased and circuit size is decreased, junction critical current is increased, resulting in the need for a higher resistance shunt resistor. As will be discussed in more detail below, the increased sheet resistance of the first resistor 18 minimizes its size and keeps circuit inductance low. Other possible applications for the first resistor 18 include use as a transmission line resistor or as any resistor that is not a bias resistor.

The second resistor 20 is used as a bias resistor to current bias circuit elements due to its higher value sheet resistance, with the current bias being set from the circuit input voltage. As with the first resistor 18, the higher sheet resistance of the second resistor 20 is necessary to reduce its size to minimize the area it occupies.

A Josephson junction 23 is provided above the second ground insulator layer 22. The Josephson junction 23 is composed of an aluminum—aluminum oxide ($Al^*AlO_x$) film 26 sandwiched between a niobium base layer 24 and a niobium counterelectrode 25. As understood by those skilled in the art, when the base layer 24 and counterelectrode 25 are cooled to a critical temperature, they enter a superconducting state in which a maximum supercurrent (critical current) is permitted.

First and second oxide insulator layers 27, 30 provide electrical isolation between the various passive and active superconductor devices while first and second interconnects 28, 32 provide superconducting electrical interconnects that may be used for superconducting loops. The first and second oxide insulator layers 27, 30 are composed of silicon dioxide and have thicknesses of preferably 200 nm and 450 nm respectively. The first and second oxide insulators 27, 30 provide electrical isolation between the Josephson junction 23 and the first and second interconnects 28, 32.

The first interconnect 28 and the second interconnect 32, which are composed of niobium wire layers each with a respective thickness of preferably 300 nm and 600 nm provide electrical communication between an outer terminal (not shown) and internal devices. These interconnects also connect the circuit elements of the wafer.

During operation of the superconductor 10, the Josephson junction 23 serves as the active device of the superconductor 10, and the first and second resistors 18, 20 serve as the passive devices. The Josephson junction 23 of the present invention provides an increased critical current density of 6 to 8 $kA/cm^2$ and consequently higher speed circuit performance. The first resistor 18 provides a sheet resistance of 3 to 5 ohm/sq that can be adjusted by varying the amount of nitrogen gas introduced during the superconductor fabrication process and that thus provides higher resistivity material as necessitated by the increased critical current.

Figure 2:
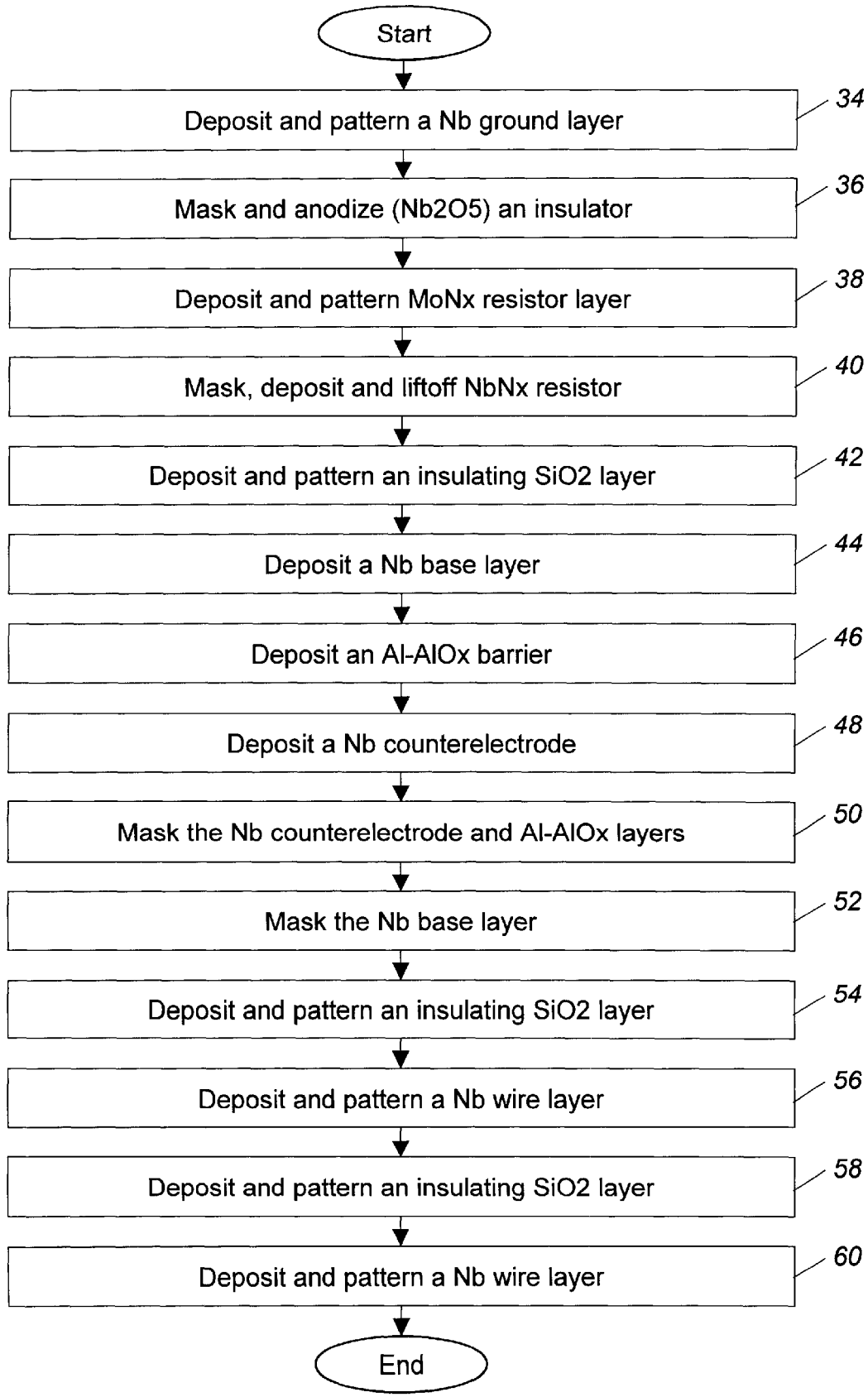
FIG. 2 is flow diagram of the preferred methodology of the present invention for fabricating the superconductor shown in FIG. 1.

A method of fabricating the superconductor 10 will now be discussed with reference to FIG. 2. At 34, niobium film of approximately 150 nm in thickness is sputter deposited over the silicon substrate 12 for forming the ground layer 14. A photolithography pattern mask is applied over the ground layer 14 and the ground layer 14 is subsequently etched via reactive ion etching.

At 36, a photoresist mask is applied over the etched ground layer 14. The masked ground layer 14 is subsequently anodized to form a film composed of niobium chemically bonded with oxygen ($Nb_2O_5$), or first ground insulator layer 16, of approximately 144 nm in thickness. As understood by those skilled in the art, the ground layer 14 could be anodized by, for example, anodic oxidation, to form the first ground insulator layer 16.

At 38, molybdenum (Mo) film with a thickness of approximately 95 nm is sputter deposited over the ground layer 14 while gaseous nitrogen ($N_2$) is introduced into the sputtering environment. The molybdenum and the $N_2$ chemically bond to form molybdenum nitride ($MoN_x$). The concentration of nitrogen is adjusted by varying the flow of gaseous nitrogen ($N_2$) during the sputter depositing. A photolithography pattern mask is applied over the molybdenum nitride film, which is subsequently etched via reactive ion etching to form the first resistor 18. The method of sputter depositing $MoN_x$ is discussed with reference to FIG. 3.

At 40, a photoresist mask is applied over the first resistor 18, first ground insulator layer 16 and ground layer 14. A niobium nitride ($NbN_x$) film of approximately 140 nm in thickness is sputter deposited over the ground layer 14. Subsequently, the photoresist mask is lifted off to form the second resistor 20. The concentration of nitrogen for the niobium nitride film is also adjusted by varying the flow of $N_2$ during the sputter depositing.

At 42, a silicon dioxide ($SiO_2$) film of approximately 150 nm in thickness is sputter deposited over the exposed layers, or the second resistor 20, first resistor 18, first ground insulator layer 16, ground layer 14 and silicon substrate 12. A photolithography pattern mask is then applied over the $SiO_2$ film and subsequently etched via reactive ion etching for forming the second ground insulator layer 22. The reactive ion etching exposes the first resistor 18, second resistor 20 and a portion of the first ground insulator layer 16.

At 44, a niobium film of approximately 150 nm in thickness is sputter deposited over the second ground insulator layer 22 for forming the base layer 24. At 46, an aluminum—aluminum oxide (Al—AlO$_x$) compound of approximately 8 nm in thickness is sputter deposited over the base layer 24 to form an Al—AlO$_x$ film 26. Specifically, the Al—AlO$_x$ film 26 is formed by first sputter depositing 8 nm of aluminum over the base layer 24, transferring the silicon substrate 12 to a separate chamber (not shown), and oxidizing the aluminum at approximately 8 mTorr for 30 minutes. At 48, a niobium film of approximately 100 nm in thickness is sputter deposited over the Al—AlO$_x$ film to form the counterelectrode 25.

At 50, a photolithography mask is applied over the counterelectrode 25 and Al—AlO$_x$ film 26, which are subsequently etched via reactive ion etching. More specifically, the Al—AlO$_x$ film is etched via an acid solution consisting of HF, HNO$_3$ and de-ionized water. At 52, a photolithography mask is applied over the base layer 24, which is subsequently etched via reactive ion etching. The reactive ion etching of the counterelectrode 25 and base layer 24 forms the Josephson junction 23.

At 54, a silicon dioxide (SiO$_2$) film of approximately 200 nm in thickness is sputter deposited over the exposed layers, or second ground insulator layer 22, base layer 24 and counterelectrode 25. A photolithography pattern mask is applied over the SiO$_2$ film, which is subsequently etched via reactive ion etching for forming the first oxide insulator layer 27. The reactive ion etching exposes a portion of the base layer 24.

At 56, a niobium wire layer of approximately 300 nm in thickness is sputter deposited over the exposed layers, or the first oxide insulator layer 27, the base layer 24 and the counterelectrode 25. A photolithography pattern mask is applied over the niobium wire layer, which is subsequently etched via reactive ion etching to form the first interconnect 28. After the reactive ion etching, the first interconnect 28 covers the exposed portion of the base layer 24 and portions of the counterelectrode 25 and the first oxide insulator layer 27.

At 58, an SiO$_2$ film of approximately 450 nm in thickness is sputter deposited over the exposed layers, or the first oxide insulator layer 27, the first interconnect 28 and the counterelectrode 25. A photolithography pattern mask is applied over the SiO$_2$ film, which is subsequently etched via reactive ion etching for forming the second oxide insulator layer 30. After the reactive ion etching, the second oxide insulator layer 30 exposes a portion of the first interconnect 28 and the counterelectrode 25.

At 60, a niobium wire layer of approximately 600 nm in thickness is sputter deposited over the exposed layers, or the second oxide insulator layer 30, the first interconnect 28 and the counterelectrode 25. A photolithography pattern mask is applied over the niobium wire layer, which is subsequently etched via reactive ion etching for forming the second interconnect 32. After the reactive ion etching, the second interconnect 32 exposes the second oxide insulator layer 30.

Figure 3:
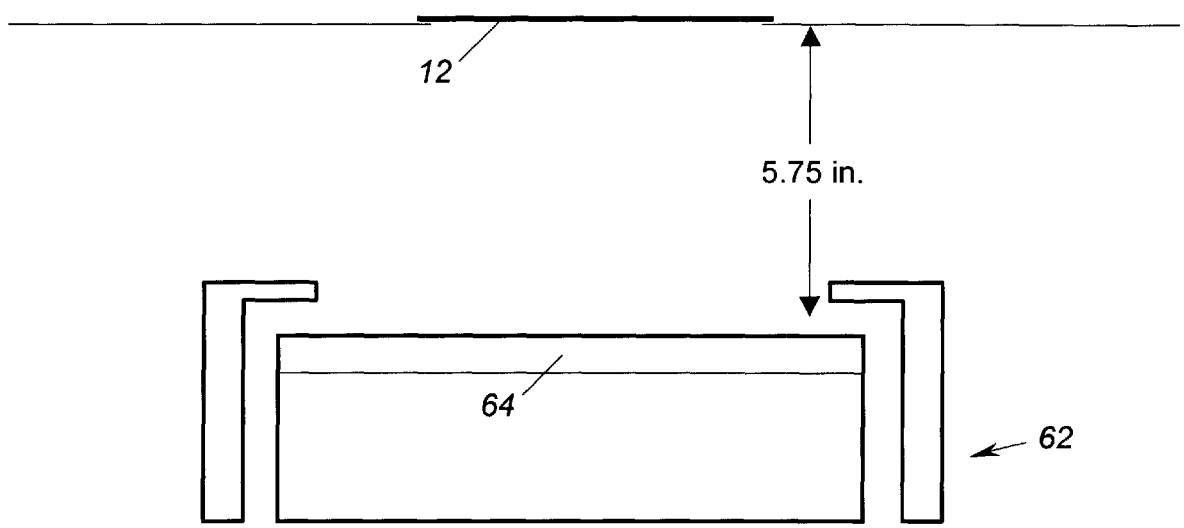
FIG. 3 is an exemplary sputtering system use in the preferred methodology of the present invention.

Referring to FIG. 3, the process for sputter depositing the MoN$_x$ film will be more fully discussed. The silicon substrate 12 (with the ground layer 14 and first ground insulator layer 16) is placed within a conventional sputtering system such as the sputtering system shown generally at 62. A molybdenum target 64, which is preferably an 8 inch molybdenum target with a purity of 99.95%, is positioned within the sputtering system 62 approximately 5.75 inches below the silicon substrate 12. The sputtering system 62 is evacuated to a pressure of less than $2 \times 10^{-7}$ Torr prior to the introduction of any gas. Ar gas is then introduced into the system with a flow rate of approximately 17 sccm. A direct current power source applies a current of 2 amperes to the molybdenum target 64. This results in positively charged Ar atoms, which in turn results in a target voltage of 335 V. The ions of the noble gas bombard the excited molybdenum target 64 and free molybdenum atoms, which are transported to the silicon substrate 12 where deposition occurs. N$_2$ is also introduced into the sputtering system 62 during deposition at a flow rate between 0.2 to 0.4 sccm resulting in a total Ar and N$_2$ pressure of 4.1 mTorr for forming the MoN$_x$ film on the silicon substrate 12. The flow rate of the N$_2$ determines the concentration of nitrogen in the film and is controlled according to superconductor application specifications.

SF$_6$ gas with a flow rate of 30 sccm at 25 mTorr pressure may be used for performing the reactive ion etching with an RF chamber power of 75 W and with an etch time of 1 to 2 minutes. This etching is performed separately after the silicon substrate 12 is removed and masked.

Figure 4A:
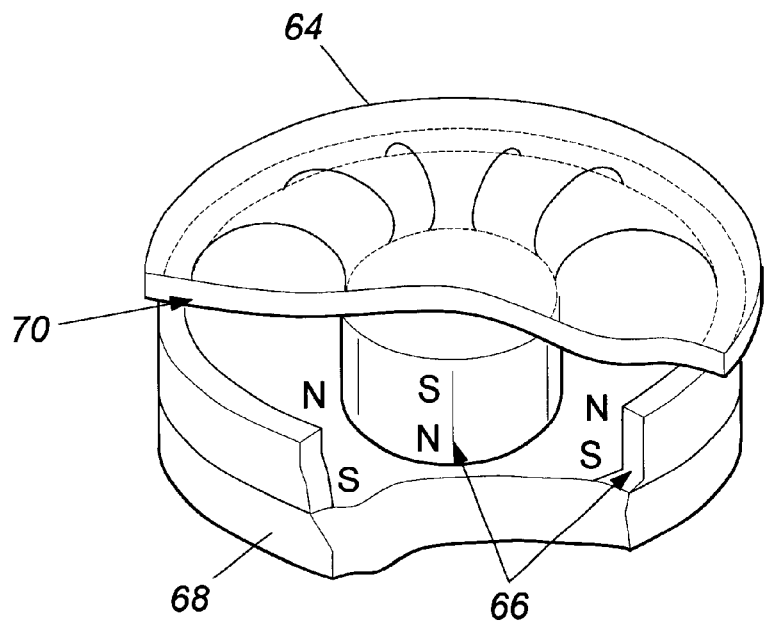
FIGS. 4A–4B are show the specifics of exemplary magnet packages that may be utilized in the sputtering system in FIG. 3.
Figure 4B:
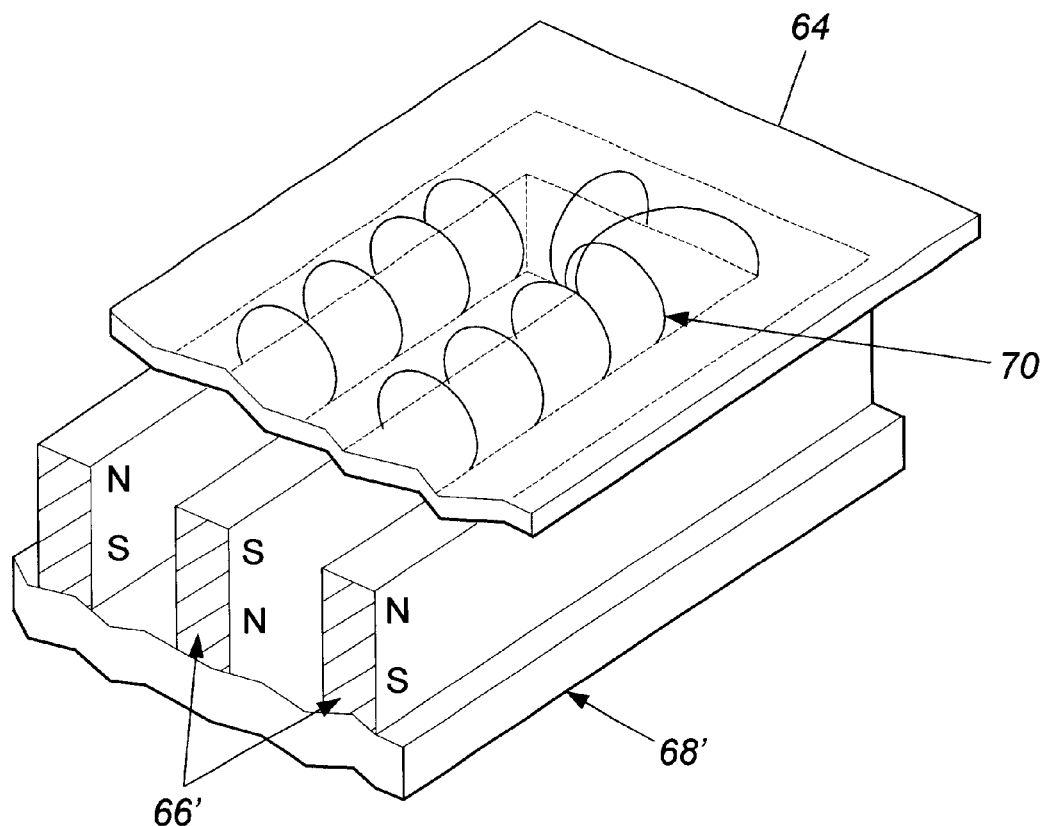

FIGS. 4A–4B show the specifics of exemplary magnet packages that are disposed generally behind the molybdenum target 64 in the sputtering system 62 in FIG. 3 to enable the sputtering system to perform DC magnetron sputtering to sputter deposit the MoN$_x$ film to form the first resistor 18 according to a preferred embodiment of the present invention. More specifically, and as understood by those skilled in the art, DC magnetron sputtering involves applying a magnetic field to the molybdenum target 64 while the target is excited. The magnetic field confines the target electrons near the target surface until they collide with the ions of the noble gas. As a result, more ions of the noble gas collide with the molybdenum target 64, which increases the film deposition rate.

When the sputter system 33 in FIG. 3 is modified to include the magnet packages of either FIG. 4A or FIG. 4B for DC magnetron sputtering, the molybdenum target 64 is provided over a plurality of permanent magnets 66, 66' attached to a pole piece 68, 68'. The permanent magnets 66, 66' have magnetic fields 70 that confine excited electrons near the surface of the molybdenum target 64. The positioning of the silicon substrate 12 and the introduction of noble gas and N$_2$ are performed as described above with respect to FIG. 3. The pole piece 68, 68' and the permanent magnets 66, 66' of FIGS. 4A–4B can be circular or rectangular.

Figure 6:
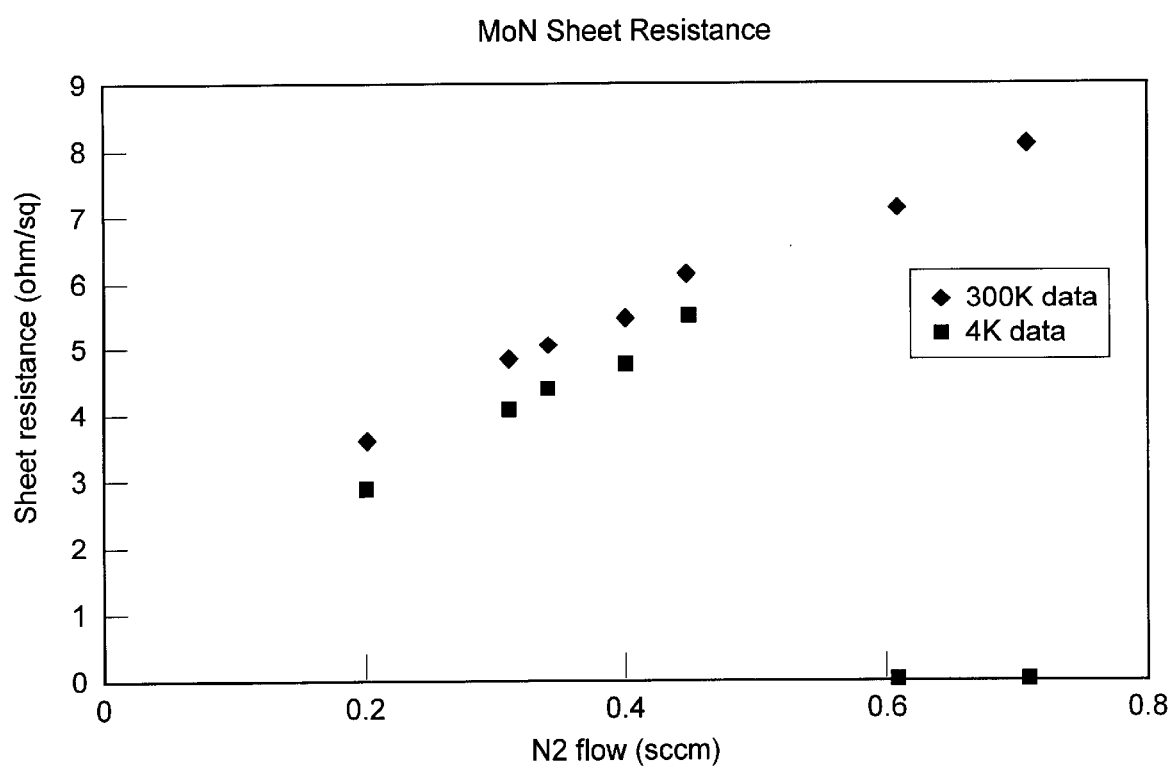
FIG. 6 is a graph of the $N_2$ flow rate versus the sheet resistance based on the data in FIG. 5.

Referring to FIGS. 5–6, the relationship between a sheet resistance of the first resistor 18 and the flow rate of N$_2$ during DC magnetron sputtering deposition is shown. Various N$_2$ flow rates were used to create a 100 nm MoN$_x$ film at a rate of 0.86 nm/sec. As shown, a flow rate of about 0.2–0.4 sccm was found to provide a sheet resistance between about 3–5 ohms/sq at 4° K.

Therefore, the present invention provides a superconductor integrated circuit 10, and a method of fabricating the same, with an improved critical current density between 6–8 kA/cm$^2$ by providing an MoN$_x$ first resistor 18 that provides a sheet resistance of between 3–5 ohms/sq at 4° K with a thickness of approximately 95 nm. Providing the superconductor integrated circuit 10 with the first resistor 18 results in a higher circuit density and smaller gate footprint.

While the above description is of the preferred embodiment of the present invention, the invention may be modified, altered, or varied without deviating from the scope and fair meaning of the following claims.

For example, pulse laser deposition or diode sputtering may alternatively be used for depositing the various layers.

Also, an $MoN_x$ resistor may alternatively be used for the second resistor 20 as well as the first resistor 18. Specifically, if the sheet resistance of $MoN_x$ is increased to 5 ohms/square, a 5 ohm/square resistor may be used in conjunction with a 0.2 ohm/square resistor, and the 12.5 ohm/square $NbN_x$ resistor would be eliminated. Consequently, the $MoN_x$ with the 5 ohm/square resistance would be used as the bias resistor, while the $MoN_x$ with the 0.2 ohm/square resistance would be used as the transmission line resistor, as well as other non-bias resistors. Although the bias resistor would be slightly larger in size than a corresponding $NbN_x$ resistor, the overall circuit size would still fall within most circuit design parameters.

What is claimed is:

1. A resistor for a Josephson junction comprising:

an $MoN_x$ film deposited in proximity to the Josephson junction, the $MoN_x$ film having a thickness of approximately 70 nm to 150 nm and a sheet resistance of approximately 3–5 ohms/square at a temperature of 4° Kelvin, wherein a value of x with respect to the $MoN_x$ film is between 0 and 1.

2. The resistor of claim 1, further comprising:

a niobium ground layer deposited on a silicon substrate and provided under the $MoN_x$ film; and an anodized niobium layer on the niobium ground layer located under the $MoN_x$ film for providing electrical isolation between the $MoN_x$ film and the niobium ground layer.

3. A superconductor integrated circuit comprising:

a silicon substrate;

a niobium ground layer formed on the silicon substrate;

a first ground insulator layer comprised of anodized niobium and provided above the niobium ground layer;

a second ground insulator layer comprised of an oxide and provided above the first ground insulator;

a resistor comprising an $MoN_x$ film and provided between the first and second ground insulator layers;

a Josephson junction provided above the first and second ground insulator layers;

a first oxide insulator and a second oxide insulator provided above the resistor; and a niobium interconnect provided above the Josephson junction for providing electrical communication therewith, wherein a value of x with respect to the $MoN_x$ is between 0 and 1.

4. The superconductor integrated circuit of claim 3, wherein:

the first ground insulator layer is further comprised of niobium oxide ($Nb_2O_5$);

the second ground insulator layer is further comprised of sputter deposited silicon dioxide ($SiO_2$); and the Josephson junction is further comprised of aluminum—aluminum oxide ($Al*AlO_x$) sandwiched between a niobium base layer and a niobium counter-electrode.

5. The superconductor integrated circuit of claim 3, wherein the first and second oxide insulators are further comprised of $SiO_2$.

6. The superconductor integrated circuit of claim 3, wherein the resistor has a film thickness of approximately 70 nm to 150 nm.

7. The superconductor integrated circuit of claim 3, further comprising another niobium interconnect for providing electrical communication with the ground layer and provided above the niobium interconnect.

8. The superconductor integrated circuit of claim 3, further comprising another resistor comprising an $NbN_x$ film provided between the first and second ground insulator layers.

* * * * *